(12) United States Patent
Ikeda et al.

(10) Patent No.: US 6,875,280 B2
(45) Date of Patent: Apr. 5, 2005

(54) SUBSTRATE PROCESSING APPARATUS AND SUBSTRATE PROCESSING METHOD

(75) Inventors: Kazuhito Ikeda, Tokyo (JP); Eisuke Nishitani, Tokyo (JP); Harunobu Sakuma, Tokyo (JP); Kazuhiro Nakagomi, Tokyo (JP)

(73) Assignee: Hitachi Kokusai Electric Inc, Tokyo (JP)

( * ) Notice: Subject to any disclaimer, the term of this patent is extended or adjusted under 35 U.S.C. 154(b) by 0 days.

(21) Appl. No.: 09/780,951

(22) Filed: Feb. 9, 2001

(65) Prior Publication Data

US 2001/0025600 A1 Oct. 4, 2001

(30) Foreign Application Priority Data

Feb. 10, 2000 (JP) ........................................ 2000-033002

(51) Int. Cl.$^7$ ........................ C23C 16/000; H01L 21/00
(52) U.S. Cl. .................. 118/719; 118/729; 156/345.31; 156/345.54; 204/298.23
(58) Field of Search ................................. 118/715, 729

(56) References Cited

U.S. PATENT DOCUMENTS

| 5,177,878 A | | 1/1993 | Visser | |
|---|---|---|---|---|
| 5,352,294 A | * | 10/1994 | White et al. | 118/725 |
| 5,520,743 A | | 5/1996 | Takahashi | |
| 5,558,717 A | * | 9/1996 | Zhao et al. | 118/715 |
| 5,653,808 A | * | 8/1997 | MacLeish et al. | 118/715 |
| 5,968,379 A | * | 10/1999 | Zhao et al. | 219/121.52 |
| 6,113,984 A | * | 9/2000 | MacLeish et al. | 427/255.32 |
| 6,176,929 B1 | * | 1/2001 | Fukunaga et al. | 118/715 |

FOREIGN PATENT DOCUMENTS

| JP | 06-020957 | 1/1994 |
|---|---|---|
| JP | 06-135795 | 5/1994 |
| JP | 08-325736 | 12/1996 |
| JP | 10-055968 | 2/1998 |
| JP | 10-298767 | 11/1998 |

* cited by examiner

*Primary Examiner*—Gregory Mills
*Assistant Examiner*—Karla Moore
(74) *Attorney, Agent, or Firm*—Hogan & Hartson, LLP

(57) ABSTRACT

A substrate processing apparatus includes a chamber, a gas introducing portion, a gas discharge port, a substrate transfer gate, and a substrate moving member which moves the substrate between a substrate processing position where the substrate is processed in the chamber and a substrate transferring in-out position in the chamber where the substrate transferred into the chamber from the substrate transfer gate is located and where the substrate is located when the substrate is transferred out from the chamber through the substrate transfer gate. The gas introducing portion, the substrate processing position, the gas discharge port and the substrate transfer gate are disposed in this order. A gas restraining member which restrains processing gas for processing the substrate from flowing toward the substrate transfer gate is provided between the gas discharge port and the substrate transfer gate.

10 Claims, 4 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method, and more particularly, to a semiconductor wafer processing apparatus and a semiconductor wafer processing method.

2. Description of the Related Art

In a conventional semiconductor wafer processing apparatus, as disclosed in Japanese Patent Application Laid-open No.10-55968, since a semiconductor wafer introducing position is located above a semiconductor wafer processing position and a discharge port position, a reaction by-product after processing adheres to a periphery of a substrate introducing port, which is prone to become a cause of particles, and it is necessary to provide a heating mechanism for preventing the adherence.

SUMMARY OF THE INVENTION

It is, therefore, a main object of the present invention to provide a processing apparatus and a processing method of a substrate such as a semiconductor wafer capable of preventing a reaction by-product from adhering, which is the problem of the conventional art, and thereby preventing particle contamination.

According to a first aspect of the present invention, there is provided a substrate processing apparatus, comprising:

a chamber;

a gas introducing portion;

a gas discharge port;

a substrate transfer gate; and a substrate moving member which moves the substrate between a substrate processing position where the substrate is processed in the chamber and a substrate transferring in-out position in the chamber where the substrate transferred into the chamber from the substrate transfer gate is located and where the substrate is located when the substrate is transferred out from the chamber through the substrate transfer gate, wherein the gas introducing portion, the substrate processing position, the gas discharge port and the substrate transfer gate are disposed in this order, and a gas restraining member which restrains processing gas for processing the substrate from flowing toward the substrate transfer gate is provided between the gas discharge port and the substrate transfer gate.

Preferably, the gas restraining member comprises at least the substrate moving member and a sidewall of the chamber.

Preferably, the chamber comprises a first chamber portion and a second chamber portion, a sidewall of the first chamber portion of the sidewall of the chamber is defined as a first sidewall, and a sidewall of the second chamber portion of the sidewall of the chamber is defined as a second sidewall, the substrate transfer gate is opened in the second sidewall, the gas discharge port is opened in the first sidewall, an inner wall of the second sidewall is located at inner side as compared with an inner wall of the first sidewall, the chamber comprises a step portion formed by projecting an upper face of the second sidewall inward of the inner wall of the first sidewall, and the gas restraining member comprises at least the substrate moving member, the second sidewall and the step portion.

In this constitution, preferably, the substrate moving member comprises a substrate placing portion and a third sidewall, and the gas restraining member comprises at least the second sidewall of the second chamber portion, the step portion and the third sidewall of the substrate moving member.

More preferably, the inner wall of the second sidewall of the second chamber portion and an outer wall of the third sidewall of the substrate moving member continuously extend along the substrate moving direction.

Preferably, when the substrate is placed on the substrate moving member and is located at least at the substrate processing position, a cover plate extending toward the first sidewall from a periphery of the substrate and having a clearance between the first sidewall and the cover plate is placed on the substrate moving member, whereby after the processing gas flowed above and on the substrate, the processing gas flows out into the gas discharge port through the clearance.

In this constitution, preferably, when the substrate moves closer to the substrate transferring in-out position than the step portion by the substrate moving member, the cover plate is held by the step portion.

Preferably, the substrate is a semiconductor wafer, and the step portion is substantially annular in shape as viewed from the gas introducing portion.

Preferably, when the substrate is placed on the substrate moving member and is located at least at the substrate processing position, the cover plate is placed on the substrate moving member such as to cover a peripheral portion of the substrate.

In this constitution, preferably, a clearance is formed between the cover plate and the substrate, gas which does not react with the substrate is supplied into the clearance from outside of the substrate.

Preferably, the substrate moving member includes a substrate placing portion and a third sidewall, and a discharge buffer space below the cover plate is constituted by the cover plate, the third sidewall of the substrate moving member, the first sidewall of the first chamber portion and the step portion.

Preferably, the clearance between the cover plate and the first sidewall of the first chamber portion is adjusted over the periphery of the cover plate to adjust a discharge amount distribution caused by the clearance between the cover plate and the first sidewall of the first chamber portion over the periphery of the cover plate, thereby adjusting a distribution of flow of the reaction gas flowing above and on the substrate.

Preferably, a distance between the gas introducing portion and the substrate and a distance between the gas introducing portion and the cover plate are adjusted by moving the substrate moving member in a state in which the substrate and the cover plate are placed on the substrate moving member.

Preferably, the cover plate can be attached to and detached from the step portion by moving the substrate moving member.

According to a second aspect of the present invention, there is provided a substrate processing apparatus, comprising:

a chamber;

a gas introducing portion;

a gas discharge port;

a substrate transfer gate;

a cover plate;

a cover plate holding portion; and a substrate moving member which moves the substrate between a substrate processing position where the substrate is processed in the chamber and a substrate transferring in-out position in the chamber where the substrate transferred into the chamber from the substrate transfer gate is located and where the substrate is located when the substrate is transferred out from the chamber through the substrate transfer gate, wherein the gas introducing portion, the substrate processing position, the gas discharge port and the substrate transfer gate are disposed in this order, when the substrate is placed on the substrate moving member and is located at least at the substrate processing position, the cover plate extending toward a sidewall of the chamber from a periphery of the substrate and having a clearance between the sidewall of the chamber and the cover plate is placed on the substrate moving member, the cover plate holding portion is provided between the substrate processing position and the substrate transferring in-out position, the cover plate holding portion allows the substrate moving member and the substrate placed on the substrate moving member to pass, but does not allow the cover plate placed on the substrate moving member to pass and holds the cover plate, and when the substrate is moved closer to the substrate transferring in-out position than the cover plate holding portion by the substrate moving means, the cover plate is held by the cover plate holding portion.

According to a third aspect of the present invention, there is provided a substrate processing method, comprising the step of processing a substrate using a substrate processing apparatus which includes:

a chamber;

a gas introducing portion;

a gas discharge port;

a substrate transfer gate;

a substrate moving member which moves the substrate between a substrate processing position where the substrate is processed in the chamber and a substrate transferring in-out position in the chamber where the substrate transferred into the chamber from the substrate transfer gate is located and where the substrate is located when the substrate is transferred out from the chamber through the substrate transfer gate, the gas introducing portion, the substrate processing position, the gas discharge port and the substrate transfer gate being disposed in this order; and a gas restraining member which restrains processing gas for processing the substrate from flowing toward the substrate transfer gate and which is provided between the gas discharge port and the substrate transfer gate, wherein in a state in which the substrate is positioned in the substrate processing position, the processing gas is introduced above and onto the substrate from the gas introducing portion, and the gas which has flowed above and on the substrate is discharged out from the gas discharge port to process the substrate.

In this constitution, preferably, when the substrate is placed on the substrate moving member and is located at the substrate processing position, a cover plate extending toward a sidewall of the chamber from a periphery of the substrate and having a clearance between the sidewall of the chamber and the cover plate is placed on the substrate moving member, whereby after the processing gas flowed above and on the substrate, the processing gas is allowed to pass through the clearance and flow out into the gas discharge port, and thereby the substrate is processed.

In this constitution, preferably, the chamber comprises a first chamber portion and a second chamber portion, a sidewall of the first chamber portion of the sidewall of the chamber is defined as a first sidewall, and a sidewall of the second chamber portion of the sidewall of the chamber is defined as a second sidewall, the substrate transfer gate is opened in the second sidewall, the gas discharge port is opened in the first sidewall, an inner wall of the second sidewall is located at inner side as compared with an inner wall of the first sidewall, the chamber comprises a step portion formed by projecting an upper face of the second sidewall inward of the inner wall of the first sidewall, the gas restraining member comprises at least the substrate moving member, the second sidewall and the step portion, and in a state in which the cover plate is held by the step portion, the substrate is positioned at the substrate transferring in-out position by the substrate moving member, the substrate is transferred in and out through the substrate transfer gate.

Preferably, when the substrate is placed on the substrate moving member and is located at the substrate processing position, the cover plate is placed on the substrate moving member such as to cover a peripheral portion of the substrate, thereby processing the substrate.

Preferably, a clearance is formed between the cover plate and the substrate, gas which does not react with the substrate is supplied into the clearance from outside of the substrate, the processing gas is supplied above and onto the substrate from the gas introducing portion, and after the processing gas has flowed above and on the substrate, the gas is allowed to pass through the clearance and to flow out into the gas discharge port, and thereby the substrate is processed.

Preferably, a distance between the gas introducing portion and the substrate and a distance between the gas introducing portion and the cover plate are adjusted by moving the substrate moving member in a state in which the substrate and the cover plate are placed on the substrate moving member.

Preferably, the chamber comprises a first chamber portion and a second chamber portion, a sidewall of the first chamber portion of the sidewall of the chamber is defined as a first sidewall, and a sidewall of the second chamber portion of the sidewall of the chamber is defined as a second sidewall, the substrate transfer gate is opened in the second sidewall, the gas discharge port is opened in the first sidewall, an inner wall of the second sidewall is located at inner side as compared with an inner wall of the first sidewall, the chamber comprises a step portion formed by projecting an upper face of the second sidewall inward of the inner wall of the first sidewall, a discharge buffer space below the cover plate is constituted by the cover plate, the substrate moving member, the first sidewall of the first chamber portion and the step portion, the processing gas is supplied above and onto the substrate from the gas introducing portion, and after the processing gas has flowed above and on the substrate, the processing gas flows through the clearance, and then flows out into the gas discharge port through the buffer space.

According to a fourth aspect of the present invention, there is provided a substrate processing method, comprising the steps of:

with a substrate processing apparatus being used, which includes:

a chamber, a gas introducing portion, a gas discharge port, a substrate transfer gate, a substrate moving member which moves the substrate between a substrate processing position where the substrate is processed in the chamber and a substrate transferring in-out position in the chamber where the substrate transferred into the chamber from the substrate transfer gate is located and where the substrate is located when the substrate is transferred out from the chamber through the substrate transfer gate, the gas introducing portion, the substrate processing position, the gas discharge port and the substrate transfer gate being disposed in this order;

a cover plate which is to be placed on the substrate moving member when the substrate is placed on the substrate moving member and is located at least at the substrate processing position, the cover plate extending toward a sidewall of the chamber from a periphery of the substrate and having a clearance between the sidewall of the chamber; and a cover plate holding portion provided between the substrate processing position and the substrate transferring in-out position, the cover plate holding portion allowing the substrate moving member and the substrate placed on the substrate moving member to pass, and the cover plate holding portion not allowing the cover plate placed on the substrate moving member to pass and holding the cover plate, the cover plate being held by the cover plate holding portion when the substrate is moved closer to the substrate transferring in-out position than the cover plate holding position by the substrate moving member, transferring the substrate into the chamber through the substrate transfer gate, thereafter placing the cover plate which has been held by the cover plate holding member onto the substrate moving member halfway through moving operation of the substrate moving member to the substrate processing position in a state in which the substrate is placed on the substrate moving member and then, moving the substrate to the substrate processing position by the substrate moving member on which the substrate and the cover plate are placed, thereafter supplying processing gas above and onto the substrate through the gas introducing portion, and after the processing gas has flowed above and on the substrate, allowing the processing gas to pass through the clearance and flow out into the gas discharge port, thereby processing the substrate; and thereafter detaching the cover plate from the substrate moving member to allow the cover plate holding portion to hold the cover plate halfway through moving operation of the substrate to the substrate transferring in-out position by the substrate moving member on which the substrate and the cover plate are placed and then, moving the substrate to the substrate transferring in-out position by the substrate moving member.

According to a fifth aspect of the present invention, there is provided a semiconductor device manufacturing method, comprising the step of processing a semiconductor substrate using a semiconductor substrate processing apparatus which includes:

a chamber;

a gas introducing portion;

a gas discharge port;

a semiconductor substrate transfer gate;

a semiconductor substrate moving member which moves the semiconductor substrate between a semiconductor substrate processing position where the semiconductor substrate is processed in the chamber and a semiconductor substrate transferring in-out position in the chamber where the semiconductor substrate transferred into the chamber from the semiconductor substrate transfer gate is located and where the semiconductor substrate is located when the semiconductor substrate is transferred out from the chamber through the semiconductor substrate transfer gate, the gas introducing portion, the semiconductor substrate processing position, the gas discharge port and the semiconductor substrate transfer gate being disposed in this order; and a gas restraining member which restrains processing gas for processing the semiconductor substrate from flowing toward the semiconductor substrate transfer gate and which is provided between the gas discharge port and the semiconductor substrate transfer gate, wherein in a state in which the semiconductor substrate is positioned in the semiconductor substrate processing position, the processing gas is introduced above and onto the semiconductor substrate from the gas introducing portion, and the gas which has flowed above and on the semiconductor substrate is discharged out from the gas discharge port to process the semiconductor substrate.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1A:
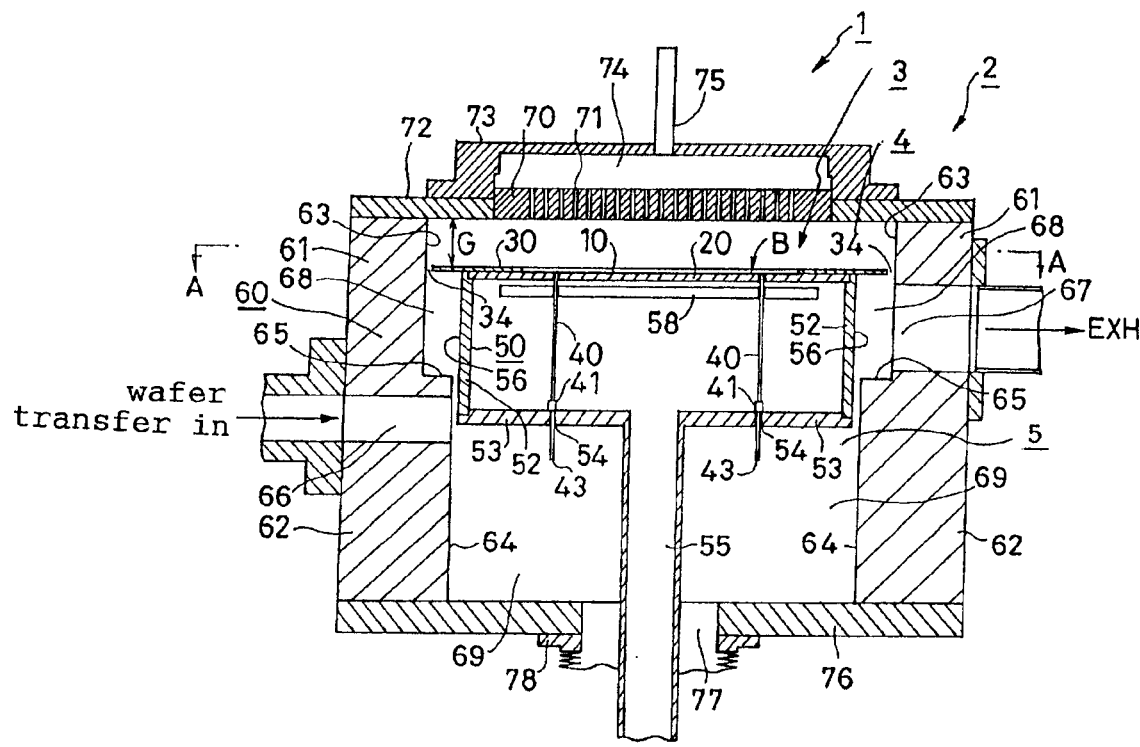
FIG. 1A is a schematic longitudinal sectional view for explaining a substrate processing apparatus and a substrate processing method according to one embodiment of the present invention.

Referring to FIGS. 1A, 1B, 2, 3, 4 and 5, a substrate processing apparatus 1 according to one embodiment of the present invention includes a chamber 2, a substrate moving mechanism 3 and a cover plate 30. The chamber 2 includes a chamber sidewall 60, a bottom plate 76, a chamber lid 72 and an upper lid 73. The chamber lid 72 is provided at its inner side with a shower plate 70. The upper lid 73 is provided such as to cover the shower plate 70. A gas introducing tube 75 is mounted to the upper lid 73. The gas introducing tube 75 is in communication with a space 74 between the upper lid 73 and the shower plate 70. The shower plate 70 is provided with a plurality of through holes 71. The bottom plate 76 is provided at its central portion with a through hole 77. A vacuum diaphragm bellows 78 for hoisting and lowering movement is mounted to the bottom plate 76, and the vacuum diaphragm bellows 78 is in communication with an interior of the chamber 2 through the through hole 77.

Figure 4:
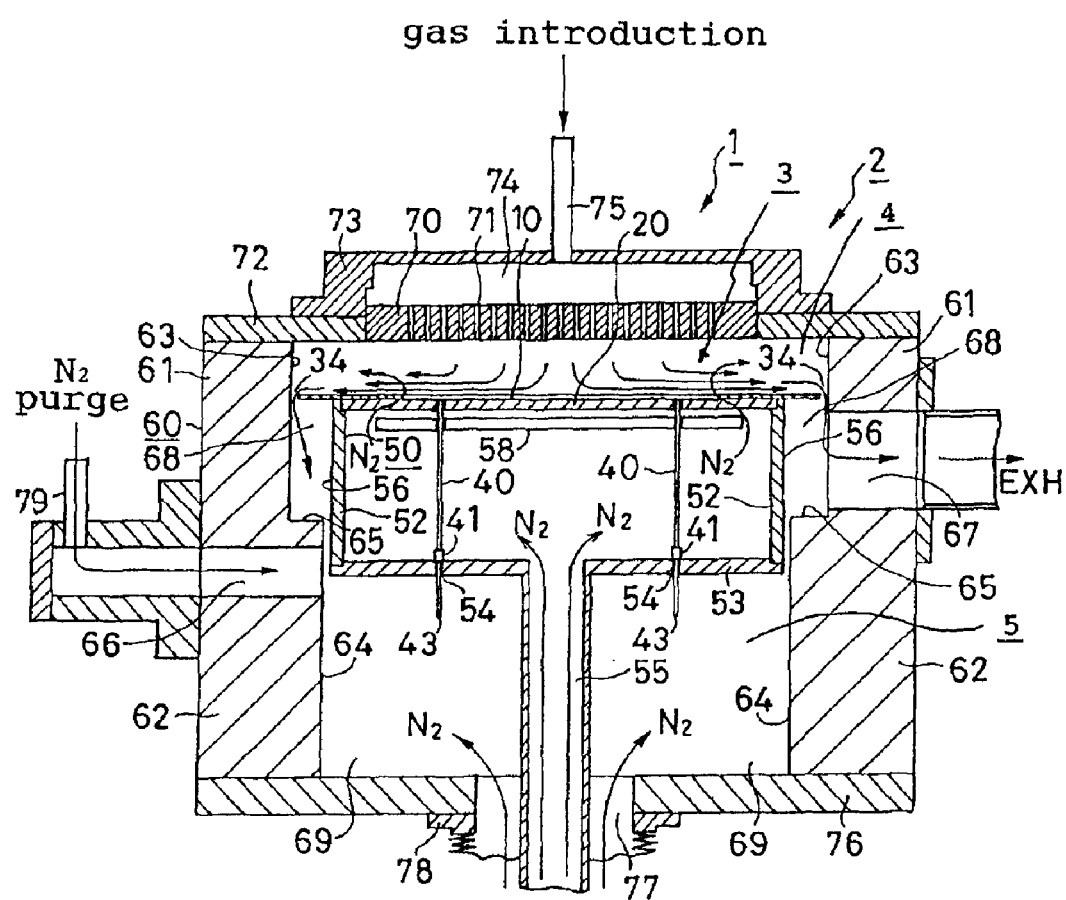
FIG. 4 is a schematic longitudinal sectional view for explaining a gas flow in the substrate processing apparatus and the substrate processing method according to the one embodiment of the present invention.

The chamber 2 comprises an upper chamber portion 4 and a lower chamber portion 5. Correspondingly, the chamber sidewall 60 also comprises a chamber upper sidewall 61 of the upper chamber portion 4 and a chamber lower sidewall 62 of the lower chamber portion 5. The chamber upper sidewall 61 is provided with a discharge port 67, and the chamber lower sidewall 62 is provided with a semiconductor wafer transfer gate 66. An inner wall 64 of the chamber lower sidewall 62 is located at inner side of the chamber 2 as compared with an inner wall 63 of the chamber upper sidewall 61. An upper face of the chamber lower sidewall 62 projecting inward from the inner wall of the chamber upper sidewall 61 is a step portion 65. The step portion 65 is substantially annular in shape as viewed from above. The inner wall 64 of the chamber lower sidewall 62 and the inner wall 63 of the chamber upper sidewall 61 extend continuously in the vertical direction. As shown in FIG. 4, the semiconductor wafer transfer gate 66 is provided with a purge tube 79 such that they are in communication with each other so that nitrogen purge can be carried out.

The substrate moving mechanism 3 includes a susceptor 20 on which a semiconductor wafer 10 is placed, a susceptor support member 50, a pin 40 for bringing up the semiconductor wafer, and a hollow shaft 55 for supporting the susceptor support member 50. The hollow shaft 55 is provided in the through hole 77 of the bottom plate 76 of the chamber 2 and in the vacuum diaphragm bellows 78. A hoisting and lowering mechanism (not shown) for hoisting and lowering the hollow shaft 55 is also provided. A heater 58 is provided below the susceptor 20 so that the semiconductor wafer 10 can be heated through the susceptor 20. The susceptor support member 50 includes a sidewall 52 and a bottom plate 53, and the susceptor 20 is supported by the sidewall 52. The sidewall 12 is provided continuously extending in the upward and downward directions. The susceptor 20 is provided at its upper face with a recess 24, and the semiconductor wafer 10 is accommodated and placed in the recess 24. The pin 40 passes through a through hole 23 formed in the susceptor 20, a through hole 59 formed in the heater 58 and a through hole 54 formed in the bottom plate 53. The pin 40 is provided at its intermediate portion with a stopper 41.

Next, a method for processing the semiconductor wafer 10 using the substrate processing apparatus 1 will be explained.

Figure 5:
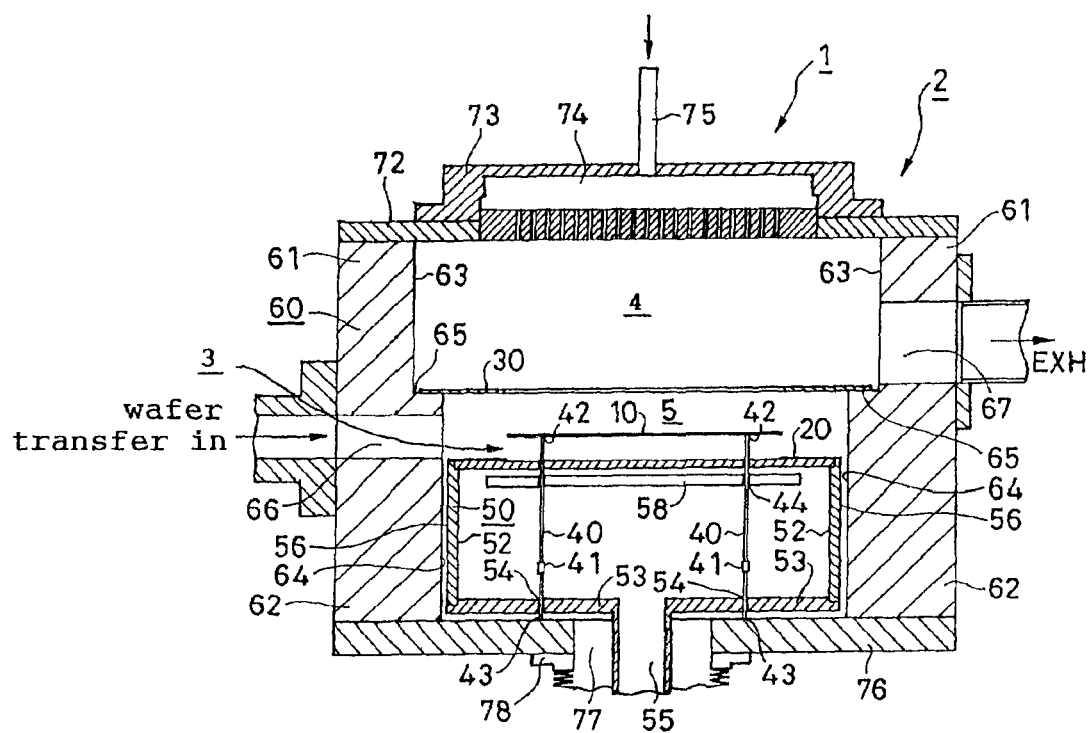
FIG. 5 is a schematic longitudinal sectional view for explaining transferring in and out of a semiconductor wafer in the substrate processing apparatus and the substrate processing method according to the one embodiment of the present invention.

First, as shown in FIG. 5, the cover plate 30 is placed on the step portion 65. The substrate moving mechanism 3 is lowered by the hosting and lowering mechanism (not shown). At that time, bases 43 of the pins 40 come in contact with the bottom plate 76 of the chamber 2 and the pins 40 are pushed upward by the bottom plate 76 so that tops 42 of the pins 40 project above the susceptor 20. Positions of the tops 42 of the pins 40 are semiconductor wafer transferring in-out position where the semiconductor wafer is transferred in and out. The semiconductor wafer 10 is transferred into the chamber 2 by a substrate transferring mechanism (not shown) through the semiconductor wafer transfer gate 66 which is opened in the chamber lower sidewall 62 of the chamber 2, and placed onto the tops 42 of the pins 40 projecting above the susceptor 20.

Figure 2:
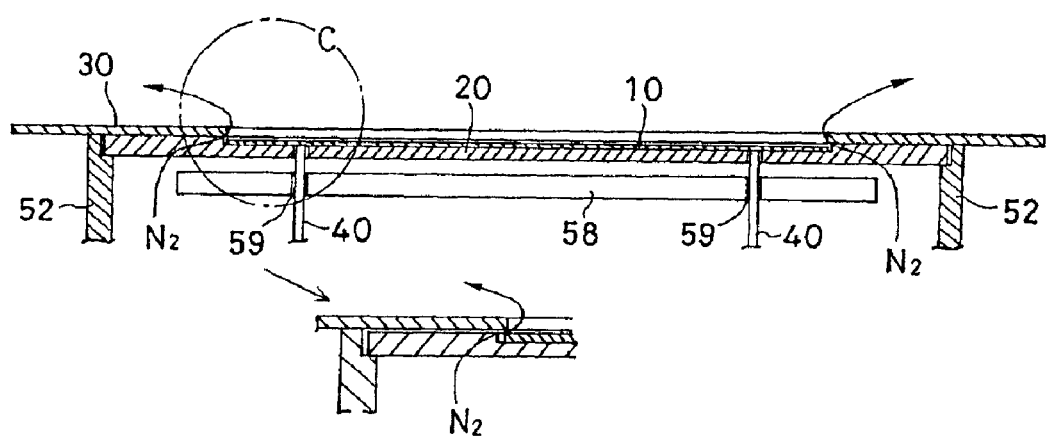
FIG. 2 is an enlarged fragmentary cross sectional view of a susceptor and a semiconductor wafer shown in FIG. 1 and their vicinities.
Figure 3:
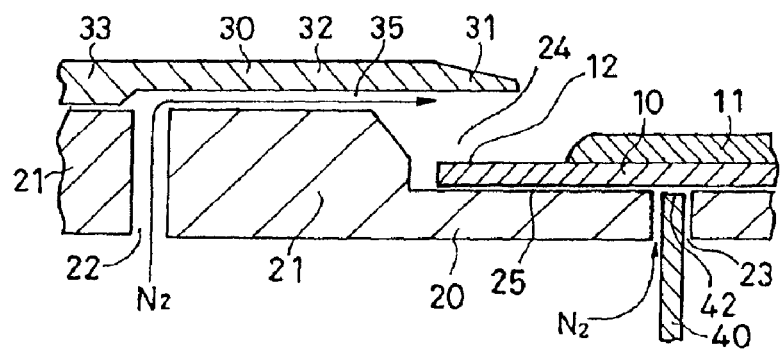
FIG. 3 is an enlarged fragmentary cross sectional view of the C portion in FIG. 2.

Thereafter, when the substrate moving mechanism 3 is hoisted by the hosting and lowering mechanism (not shown), the height of the pins 40 with respect to the susceptor 20 is lowered as shown in FIG. 1A, and when the stoppers 41 come into contact with the bottom plate 53 of the substrate moving mechanism 3, the tops 42 of the pins 40 are moved to a position below an upper face 25 of the recess 24 of the susceptor 20 as shown in FIGS. 2 and 3, and the semiconductor wafer 10 is placed in the recess 24 of the susceptor 20.

Then, when the substrate moving mechanism 3 is further hoisted, the cover plate 30 which has been placed on the step portion 65 is placed onto the susceptor 20. As shown in FIGS. 2 and 3, a periphery 21 of the susceptor 20 is thicker than a central portion thereof, a surface of the periphery 21 is higher than a surface 25 of the recess 24 and therefore, the cover plate 30 is placed onto the periphery 21 of the susceptor 20.

Figure 1B:
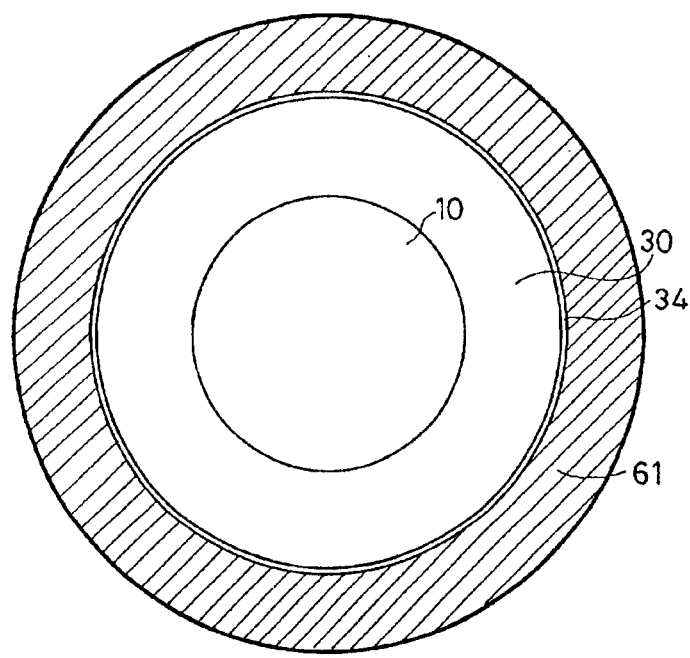
FIG. 1B is a transversal sectional view taken along line AA in FIG. 1A.

As shown in FIG. 1B, the cover plate 30 is substantially annular in shape as viewed from above. As shown in FIG. 3, a body 33 of the cover plate 30 is placed on the periphery 21 of the susceptor 20. An inner side of the cover plate 30 is formed as a thin portion 32, and a clearance 35 is formed between the thin portion 32 and the periphery 21 of the susceptor 20. An inner tip end 31 of the cover plate 30 covers a periphery 12 of the semiconductor wafer 10. By covering the periphery 12 in this manner, it is possible to prevent a film from being formed on the periphery 12 of the semiconductor wafer 10. The inner tip end 31 is not in contact with the periphery 12 of the semiconductor wafer 10, and a clearance exists between the inner tip end 31 and the periphery 12. The periphery 21 of the susceptor 20 is formed with a through hole 22, and inert gas (e.g., nitrogen gas) is supplied from below of the susceptor 20 onto the periphery 12 of the semiconductor wafer 10 through the through hole 22 and the clearance 35 between the thin portion 32 inside the cover plate 30 and the periphery 21 of the susceptor 20. This arrangement prevents a film from being formed on the periphery 12 of the semiconductor wafer 10 more reliably.

When the substrate moving mechanism 3 on which the semiconductor wafer 10 and the cover plate 30 are placed as described above is further hoisted, the semiconductor wafer 10 moves to a semiconductor wafer processing position as shown in FIG. 1A. Then, the semiconductor wafer 10 is subjected to processing (forming a film 11, for example).

In this case, processing gas contributing to the reaction is supplied from a gas introducing tube 75, and supplied onto the semiconductor wafer 10 through a large number of through holes 71 formed in the shower plate 70 through the space 74.

An annular clearance 34 is formed between the cover plate 30 and the inner wall 63 of the upper sidewall 61. The processing gas which has flowed above and on the semiconductor wafer 10 flows above the cover plate 30 and then flows into the discharge port 67 through the clearance 34. This clearance 34 is rectifying means to the discharge port 67.

The semiconductor wafer 10 is heated by the heater 58 disposed below the susceptor 20, and reacts with the processing gas, and a film is formed on the semiconductor wafer 10. As shown in FIG. 4, gas which did not contribute the film formation and a reaction by-product flow through the annular clearance 34 in accordance with gas flow above the cover plate 30 and are discharged out of the chamber 2 from the discharge port 67. At that time, since the discharge port 67 is located below the processing position of the semiconductor wafer 10 and above the semiconductor wafer transfer gate 66, the processing gas is prevented from flowing into the semiconductor wafer transfer gate 66, and it is possible to prevent the reaction by-product which can become a cause of particles from adhering.

By introducing inert gas (e.g., $N_2$) from the purge tube 79 through the semiconductor wafer transfer gate 66, it is possible to further prevent the reaction by-product from adhering. $N_2$ is also introduced into the substrate moving mechanism 3 and is allowed to flow between the susceptor 20 and the cover plate 30 toward the semiconductor wafer edge, as shown in FIG. 3. A purpose of this arrangement is to prevent a film from being formed on the wafer edge portion.

A probability of adhesion of the reaction by-product to a chamber lower space 69 of the lower chamber portion 5 located lower than the discharge port 67 is low. This probability can be further lowered by introducing the inert gas (e.g., $N_2$) from the vacuum diaphragm bellows 78 through the through hole 77.

After the processing of the semiconductor wafer is completed at the semiconductor wafer processing position, the substrate moving mechanism 3 is lowered, and the substrate moving mechanism 3 places the cover plate 30 on the step portion 30. Thereafter, the lowering operation of the substrate moving mechanism 3 on which the semiconductor wafer 10 is placed is continued, and as shown in FIG. 5, the bases 43 of the pins 40 come into contact with the bottom plate 76 of the chamber 2 and projected by the bottom plate 76 so that the tops 42 of the pins 40 project above the susceptor 20. The semiconductor wafer 10 is placed onto the tops 42 of the projecting pins 40. A position of the tops 42 of the pins 40 is the semiconductor wafer transferring in-out position where the semiconductor wafer is transferred in and out. The semiconductor wafer is transferred out from the chamber 2 by the substrate transferring mechanism (not shown) through the semiconductor wafer transfer gate 66 opened in the chamber lower sidewall 62 of the chamber 2.

In the present embodiment, the reason why the inner wall 64 of the chamber lower sidewall 62 is provided at inner side of the chamber 2 as compared with the inner wall 63 of the chamber upper sidewall 61, and the upper face of the chamber lower sidewall 62 projects to inner side as compared with the inner wall of the chamber upper sidewall 61 to form the step portion 65 is as follows:

That is, in order to adjust a discharge amount, the annular clearance 34 between the periphery of the cover plate 30 and the upper sidewall inner wall 63 of the chamber 2 is adjusted to reduce the discharge amount. In order to uniformly discharge with the reduced discharge flow, it is preferable to provide buffer space at downstream. A discharge buffer space 68 is formed by the step portion 65, the upper sidewall inner wall 63, the cover plate 30 and the side wall outer face 56 of the sidewall 52 of the substrate moving mechanism 3.

Further, in order to prevent the processing gas from flowing into the chamber lower space 69 located below the step portion 65 during processing of the semiconductor wafer 10, the inner wall 64 of the chamber lower sidewall 62 is located at inner side of the chamber 2 as compared with the inner wall 63 of the chamber upper sidewall 61 to narrow the space between the inner wall 64 of the chamber lower sidewall 62 and the side wall outer face 56 of the substrate moving mechanism 3. The inner wall 64 of the chamber lower sidewall 62 and the side wall outer face 56 of the substrate moving mechanism 3 continuously extend downward.

As described above, the inner wall 64 of the chamber lower sidewall 62 is provided at inner side of the chamber 2 as compared with the inner wall 63 of the chamber upper sidewall 61, and the upper face of the chamber lower sidewall 62 projects to inner side as compared with the inner wall of the chamber upper sidewall 61 to form the step portion 65. Therefore, the discharge buffer space is formed above the step portion, and gas is prevented from flowing into the chamber lower space 69 located lower than the discharge buffer space.

As described above, the cover plate 30 is disposed such as to cover a portion of the semiconductor wafer periphery from above, the semiconductor wafer 10 can not be separated from the susceptor 20 without detaching the cover plate 30, but by providing the step portion 65, the cover plate 30 can be held halfway through the downward movement of the substrate. As a result, after the cover plate 30 is detached from the susceptor 20, the wafer can be brought up from the susceptor 20.

In the above description, the cover plate 30 is not fixed to the chamber 2, but is placed on the step portion 65 and then is carried upward by the substrate moving mechanism 3. Therefore, it is easy to attach and detach the cover plate 30. Thus, it is also easy to change the shape of the cover plate 30 and therefore, the flow distribution of the reaction gas flowing above and on the semiconductor wafer 10 can be adjusted by adjusting the clearance 34 around the cover plate 30 to adjust the discharge amount distribution by the clearance 34 around the cover plate 30. For example, in order to uniform the discharge, it is possible to easily adjust, e.g., reduce the clearance 34 on the side of the discharge port 67 and to increase the clearance 34 on the other side from the discharge port 67. Further, it is also easy to adjust the shape of the clearance 34 over the periphery of the cover plate in accordance with the processing condition such as processing pressure. Further, since it is easy to detach the cover plate 30 as described above, the cover plate 30 can easily be cleaned.

When the semiconductor wafer 10 is subjected to processing, it is necessary to adjust a gap between the shower plate 70 and the semiconductor wafer 10 and a gap G between the shower plate 70 and the cover plate 30 in accordance with processing conditions such as film forming conditions of each process, and in accordance with producing error (individual difference) or the like of each apparatus. This adjustment can also be carried out easily by vertically moving the susceptor 20, and the substrate moving mechanism 3 on which the semiconductor wafer 10 and the cover plate 30 are placed. Further, it is also easy to perform a fine adjustment of a gap associated with process result.

If the cover plate 30 is fixed, the semiconductor wafer 10 is allowed to approach the cover plate 30 from below. At that time, there is a possibility that a clearance (about 0.8 mm)

between the cover plate 30 and the semiconductor wafer can not be adjust correctly due to precision of the hosting and lowering mechanism of the substrate moving mechanism. Contrary to this, in the present embodiment, the cover plate 30 is placed on the periphery 21 of the susceptor 20 halfway through the hoisting operation of the substrate moving mechanism. Therefore, the clearance between the cover plate 30 and the semiconductor wafer is determined only by the shape of each of the susceptor 20 and the cover plate 30, its precision is high.

Further, according to the apparatus of the present embodiment, the cover plate 30 is picked up halfway through the hoisting operation of the semiconductor wafer, one driving source suffices. It is conceivable that the cover plate 30 is lowered from above, but in this case, a cover plate driving source and a wafer hoisting driving source are separately required, which increases costs.

As described above, according to the substrate processing apparatus and the substrate processing method of the present invention, reaction by-product can be prevented from adhering, and thereby particle contamination can be prevented.

The entire disclosure of Japanese Patent Application No. 2000-033002 filed on Feb. 10, 2000 including specification, claims, drawings and summary are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A substrate processing method, comprising processing a substrate using an apparatus which includes:
   a chamber;
   a gas introducing portion;
   a gas discharge port;
   a substrate transfer gate;
   a substrate moving member which moves said substrate between a substrate processing position where said substrate is processed in said chamber and a substrate transferring in-out position in said chamber where said substrate transferred into said chamber from said substrate transfer gate is located and where said substrate is located when said substrate is transferred out from said chamber through said substrate transfer gate, said gas introducing portion, said substrate processing position, said gas discharge port and said substrate transfer gate being disposed in this order;
   a gas restraining member which restrains processing gas for processing said substrate from flowing toward said substrate transfer gate and which is provided between said gas discharge port and said substrate transfer gate; and
   a cover plate,
   said chamber including a step portion projecting from an inner wall of a sidewall of said chamber, and said step portion being located between said gas discharge port and said substrate transfer gate, wherein
   in a state in which said substrate is placed on said substrate moving member and is positioned at said substrate processing position, and said cover plate is placed on said substrate moving member extending toward the sidewall of said chamber from a periphery of said substrate and having a clearance between the sidewall of said chamber and said cover plate, said processing gas is introduced above and onto said substrate from said gas introducing portion, and a majority of said gas which has flowed above and on said substrate then flows into a discharge buffer space constituted below said cover plate by said cover plate, a sidewall of said substrate moving member, the sidewall of said chamber and said step portion through said clearance, and is discharged out from said gas discharge port to process said substrate.

2. A semiconductor device manufacturing method, comprising processing a substrate using an apparatus which includes:
   a chamber;
   a gas introducing portion;
   a gas discharge port;
   a substrate transfer gate;
   a step portion projecting inward of a side wall of said chamber; and
   a substrate moving member which moves said substrate between a substrate processing position where said substrate is processed in said chamber and a substrate transferring in-out position in said chamber where said substrate transferred into said chamber from said substrate transfer gate is located and where said substrate is located when said substrate is transferred out from said chamber through said substrate transfer gate,
   said gas discharge port being lower than said substrate processing position, said substrate transfer gate being lower than said gas discharge port, and said step portion being lower than said substrate processing position, to form a discharge passage to said gas discharge port, said discharge passage including said side wall of said chamber, said step portion and a side wall of said substrate moving member, wherein
   a majority of processing gas flows in said discharge passage to said gas discharge port.

3. A substrate processing method, comprising processing a substrate using an apparatus which includes:
   a chamber;
   a gas introducing portion;
   a gas discharge port;
   a substrate transfer gate;
   a substrate moving member which moves said substrate between a substrate processing position where said substrate is processed in said chamber and a substrate transferring in-out position in said chamber where said substrate transferred into said chamber from said substrate transfer gate is located and where said substrate is located when said substrate is transferred out from said chamber through said substrate transfer gate, said gas introducing portion, said substrate processing position, said gas discharge port and said substrate transfer gate being disposed in this order,
   a gas restraining member which restrains processing gas for processing said substrate from flowing toward said substrate transfer gate and which is provided between said gas discharge port and said substrate transfer gate; and
   a cover plate, wherein
   said chamber includes a first chamber portion and a second chamber portion,
   a sidewall of said first chamber portion of the sidewall of said chamber is defined as a first sidewall, and a sidewall of said second chamber portion of the sidewall of said chamber is defined as a second sidewall, said substrate transfer gate is opened in said second sidewall, said gas discharge port is opened in said first sidewall, an inner wall of said second sidewall is located at an inner side as compared with an inner wall of said first sidewall, said chamber comprises a step portion formed by projecting an upper face of said second sidewall inward of the inner wall of said first sidewall, said gas restraining member includes at least said substrate moving member, said second sidewall and said step portion, said substrate moving member includes a substrate placing portion and a third sidewall, a discharge buffer space is constituted below said cover plate by said cover plate, said third sidewall of said substrate moving member, said first sidewall of said first chamber portion and said step portion, and when said substrate is placed on said substrate placing portion of said substrate moving member and is located at said substrate processing position, said cover plate is placed on said substrate moving member, said cover plate extending toward said first sidewall from a periphery of said substrate and having a clearance between said first sidewall and said cover plate, wherein after said processing gas has flowed above and on said substrate, a majority of said processing gas flows into said gas discharge buffer space through said clearance and flows out from said gas discharge port.

4. A substrate processing method as recited in claim 3, wherein when said substrate moves closer to said substrate transferring in-out position than said step portion by said substrate moving member, said cover plate is held by said step portion.

5. A substrate processing method as recited in claim 3, wherein when said substrate is placed on said substrate moving member and is located at least at said substrate processing position, said cover plate is placed on said substrate moving member such as to cover a peripheral portion of said substrate.

6. A substrate processing method as recited in claim 4, wherein when said substrate is placed on said substrate moving member and is located at least at said substrate processing position, said cover plate is placed on said substrate moving member such as to cover a peripheral portion of said substrate.

7. A substrate processing method as recited in claim 3, wherein said clearance between said cover plate and said first sidewall of said first chamber portion is adjusted over the periphery of said cover plate to adjust a discharge amount distribution caused by said clearance between said cover plate and said first sidewall of said first chamber portion over the periphery of said cover plate, thereby adjusting a distribution of flow of said reaction gas flowing above and on said substrate.

8. A substrate processing method as recited in claim 3, wherein a distance between said gas introducing portion and said substrate and a distance between said gas introducing portion and said cover plate are adjusted by moving said substrate moving member in a state in which said substrate and said cover plate are placed on said substrate moving member.

9. A substrate processing method as recited in claim 3, wherein said cover plate can be attached to and detached from said step portion by moving said substrate moving member.

10. A substrate processing method, comprising processing a substrate using an apparatus which includes:

a chamber;

a gas introducing portion;

a gas discharge port;

a substrate transfer gate;

a cover plate;

a cover plate holding portion; and a substrate moving member which moves said substrate between a substrate processing position where said substrate is processed in said chamber and a substrate transferring in-out position in said chamber where said substrate transferred into said chamber from said substrate transfer gate is located and where said substrate is located when said substrate is transferred out from said chamber through said substrate transfer gate, wherein said gas introducing portion, said substrate processing position, said gas discharge port and said substrate transfer gate are disposed in this order, when said substrate is placed on said substrate moving member and is located at said substrate processing position, said cover plate extending toward a sidewall of said chamber from a periphery of said substrate and having a clearance between said sidewall of said chamber is placed on said substrate moving member, said cover plate holding portion is provided between said substrate processing position and said substrate transferring in-out position, said cover plate holding portion allows said substrate moving member and said substrate placed on said substrate moving member to pass, but does not allow said cover plate placed on said substrate moving member to pass, and holds said cover plate, when said substrate is moved closer to said substrate transferring in-out position than said cover plate holding portion by said substrate moving member, said cover plate is held by said cover plate holding portion, and a discharge buffer space is constituted below said cover plate by said cover plate, a sidewall of said substrate moving member, a sidewall of said chamber and said cover plate holding portion, wherein after said processing gas has flowed above and on said substrate, a majority of said processing gas flows into said discharge buffer space through said clearance and flows out from said gas discharge port.

* * * * *